(12) United States Patent
Fujita et al.

(10) Patent No.: US 7,078,908 B2
(45) Date of Patent: Jul. 18, 2006

(54) VOLTAGE DETECTING APPARATUS APPLICABLE TO A COMBINATION BATTERY

(75) Inventors: Hiroshi Fujita, Kuwana (JP); Yuji Kito, Nagoya (JP)

(73) Assignee: Denso Corporation, Kariya (JP)

( * ) Notice: Subject to any disclaimer, the term of this patent is extended or adjusted under 35 U.S.C. 154(b) by 119 days.

(21) Appl. No.: 10/776,611

(22) Filed: Feb. 12, 2004

(65) Prior Publication Data

US 2004/0160229 A1    Aug. 19, 2004

(30) Foreign Application Priority Data

Feb. 19, 2003    (JP)    ............................. 2003-041354

(51) Int. Cl.
*G01N 27/416*    (2006.01)

(52) U.S. Cl. ........................ 324/433; 320/116; 324/434

(58) Field of Classification Search ................ 320/116, 320/167, 133, 135, 158–159, 155; 324/434, 324/433

See application file for complete search history.

(56) References Cited

U.S. PATENT DOCUMENTS 6,020,717 A * 2/2000 Kadouchi et al. ........... 320/116
6,362,627 B1 * 3/2002 Shimamoto et al. ........ 324/434

FOREIGN PATENT DOCUMENTS

JP    A 11-248755    9/1999
JP    A 2002-156392    5/2002

\* cited by examiner

*Primary Examiner*—Adolf Deneke Berhane
*Assistant Examiner*—Robert Grant
(74) *Attorney, Agent, or Firm*—Oliff & Berridge, PLC

(57) ABSTRACT

A voltage detecting apparatus for a combination battery includes a multiplexer type flying capacitor voltage detecting circuit, a synchronous control type A/D converter, and a battery controller. The battery controller has a timing table to regulate generation timings of a switching control signal, an activation signal, and a transfer command signal on a common time axis. The timing control is carried out by outputting the switching control signal, the activation signal, and the transfer command signal to the flying capacitor voltage detecting circuit, the A/D converter, and the battery controller at the timing regulated in the timing table and according to an order memorized in the timing table.

6 Claims, 6 Drawing Sheets

VOLTAGE DETECTING APPARATUS APPLICABLE TO A COMBINATION BATTERY

BACKGROUND OF THE INVENTION

The present invention relates to a flying capacitor battery voltage detecting apparatus.

A flying capacitor voltage detecting circuit is known as a voltage detecting apparatus preferably applicable to a combination battery which includes a plurality of battery modules, each including a single or a plurality of serially connected cells, which are arranged in series. This flying capacitor voltage detecting circuit performs the voltage read-in processing for sample holding the voltage of a voltage source in a flying capacitor in response to turning-on of an input side sampling switch and the voltage read-out processing for applying a charged voltage of the flying capacitor between a pair of input terminals of a differential amplification circuit by turning on an output side sampling switch after the input side sampling switch is turned off.

Nowadays, a digital signal processing based on a microcomputer or a comparable processor is generally used in the computation processing for a detected module voltage of the combination battery. And, it is necessary to cause an A/D converter to execute the A/D conversion applied to the analog output voltage produced from the differential amplification circuit and also cause a microcomputer-based battery controller to read the A/D converted data in a time sequential fashion.

Namely, the module voltage detection using a flying capacitor voltage detecting circuit necessarily requires the voltage read-in processing, the voltage read-out processing, the A/D conversion processing, and the data transfer processing for transferring the digital voltage signal to a data memory of the microcomputer, as described above, for each of the battery modules.

In this case, the A/D conversion processing is an operation for sample holding the analog output voltage of the differential amplification circuit at the designated sample hold timing and executing the A/D conversion of the sampled voltage, and then holding a produced digital voltage signal until a succeeding digital voltage signal is produced. The data transfer processing is an operation for supplying the digital voltage signal being held at an output section of the A/D converter into an input port of the microcomputer and for storing the readout voltage data in a predetermined memory area of the microcomputer. The A/D converter needs to successively execute the A/D conversion applied to the module voltage produced from the differential amplification circuit. The microcomputer needs to successively write the digital voltage signal appearing at the output section of the A/D converter into its memory area.

However, hybrid vehicles, motor-driven vehicles, fuel-cell vehicles are equipped with a combination battery generally consisting of several hundreds of cells being connected in series. The combination battery is generally divided into several tens or several hundreds of battery modules. As a result, to accomplish the voltage detection of the combination battery entirely, each battery module needs to execute the above-described voltage read-in processing, the voltage read-out processing, the A/D conversion processing, and the data transfer processing to the data memory of the microcomputer at appropriate timings.

If the module voltage detecting operations of respective battery modules are executed in parallel with each other, the processing time will be substantially extendable. However, the scale for such a circuit will become too big to realize. Accordingly, it is usual that the input side sampling switch of a flying capacitor voltage detecting circuit is constituted by a multiplexer so that several tens or several hundreds of module voltages can be read into a single or a plurality of flying capacitors in a time sequential manner.

However, using the multiplexer serving as an input side sampling switch will complicate the above-described voltage read-in processing due to necessary switching control for the multiplexer. The time sequential control of various portions of the voltage detecting apparatus of a combination battery will become further complicated. The processing time available for each module voltage will be greatly reduced. As a result, the allocated time for the voltage read-in processing (i.e., the essential CR charging operation) becomes short. In other words, the flying capacitor will not be saturated with charging. It becomes difficult to accurately execute the voltage read-in processing. Furthermore, the computation load of the microcomputer will become large. The microcomputer will be subjected to the incoming noises accompanying the complicated and speedy switching controls of various portions. Due to adverse influence of the noises, the control timings will be so asynchronous to result in erroneous detection.

To solve this problem, the Japanese Patent Application Laid-open No. 2002-156392 proposes a parallel read-in system including a plurality of flying capacitors arranged in parallel to each other to read module voltages through a multiplexer. However, if the number of flying capacitors and the A/D converters is not increased, a multiplexer serving as an output side sampling switch will be necessary for the voltage read-out processing. The switching control, i.e., timing control, of a circuit system is not simple. The microcomputer will be still bothered with a large processing or computation burden for the A/D conversion processing and the storage processing. In this manner, to reduce the adverse influence of dispersion in switching control timings as well as asynchronism of A/D operation timings, the microcomputer is given a large burden for timing controls.

SUMMARY OF THE INVENTION

In view of the above-described problems, the present invention has an object to provide a flying capacitor voltage detecting apparatus which is capable of improving the measuring accuracy while preventing the circuit arrangement from becoming complicated.

In order to accomplish the above and other related objects, the present invention provides a first voltage detecting apparatus for a combination battery including a multiplexer type flying capacitor voltage detecting circuit, a synchronous control type A/D converter, and a battery controller. The multiplexer type flying capacitor voltage detecting circuit has an input multiplexer and an output side sampling switch. The operation timing of the flying capacitor voltage detecting circuit is controlled in response to an entered switching control signal for time sequentially executing voltage read-in processing and voltage read-out processing to detect the voltage of a plurality of battery modules of a combination battery in a time sequential fashion. The synchronous control type A/D converter, whose operation timing is controlled in response to an entered activation signal, is provided for sample holding and A/D converting an analog output voltage of the flying capacitor voltage detecting circuit and also holding a digital voltage signal as a resulting output until a succeeding digital voltage signal is obtained. The battery controller, whose operation timing is controlled in response to an entered transfer command signal, is provided for reading the digital voltage signal produced from the A/D converter and storing the readout digital voltage signal into a data storage area assigned to each of the battery modules.

Furthermore, according to the first voltage detecting apparatus of the present invention, the battery controller includes a timing table on which generation timings of the switching control signal, the activation signal, and the transfer command signal are all determined on a common time axis. And, timing control for the flying capacitor voltage detecting circuit, the A/D converter, and the battery controller is carried out by outputting the switching control signal, the activation signal, and the transfer command signal to the flying capacitor voltage detecting circuit, the A/D converter, and the battery controller at the timing regulated in the timing table and according to an order memorized in the timing table.

With this arrangement, it becomes possible to provide a flying capacitor voltage detecting apparatus which is capable of improving the measuring accuracy while preventing the circuit arrangement from becoming complicated.

The first voltage detecting apparatus according to this invention successively reads out event information at predetermined time intervals. Each event information consists of a switch operation event memorized beforehand in a table for commanding a turning on-and-off operation of analog switch group, an A/D activation event memorized beforehand in a table for commanding activation of the A/D converter, and a memory storage event memorized beforehand in a table for storing the digitized block voltage into a memory corresponding to each battery block. The first voltage detecting apparatus executes the port processing or the data conversion processing corresponding to the event information, produces a switching pattern for the analog switch group of the flying capacitor voltage detecting circuit, and sequentially measures block voltages.

With this arrangement, it becomes possible to simplify the conditional branch processing and accordingly increase the speed of a processing apparatus. The delay time in the processing apparatus can be shortened. It becomes possible to suppress the fluctuation in the switching pulse width as well as the delay in A/D activation. Thus, the voltage detection having less dispersion is realized.

More specifically, according to the control of a conventional flying capacitor voltage detecting circuit, each group has its own timing counter for determining the timings of events although all of the groups are controlled according to a timing pulse produced based on the common clock pulse. The timing counter of each group independently controls the flying capacitor voltage detecting circuit, the A/D converter, and the battery controller. Accordingly, in the case that the processing time for each module voltage is short in the multiplexer type flying capacitor voltage detecting circuit or the like, there is the possibility that microcomputer cannot finish the processing within a scheduled time. In other words, the timing synchronization among the flying capacitor voltage detecting circuit, the A/D converter, and the battery controller cannot be maintained adequately.

On the contrary, this invention prepares a timing table for producing the switching control signal which regulates a switching timing of the flying capacitor voltage detecting circuit, the activation signal which regulates a switching timing of the A/D converter, and the transfer command signal which regulates read-out and read-in (i.e., port opening) timings from the A/D converter to a predetermined storage area of the microcomputer. This timing table operates on a common time axis (by using a common timing counter).

The switching control signal, the activation signal, and the transfer command signal are sequentially produced at the timings regulated on the common time axis even when the time allocated to the processing of each module voltage becomes short due to the use of a multiplexer. According to this arrangement, timing relationship among those signals can be surely maintained. Thus, reliable and excellent module voltage detection can be realized.

According to the first voltage detecting apparatus for a combination battery of the present invention, it is preferable that the battery controller gives first priority to the output of the switching control signal supplied to the flying capacitor voltage detecting circuit in a case that the timing table regulates signal generation timings in such a manner that the generation timing of the switching control signal equals to or overlaps with the generation timing of the activation signal or the transfer command signal, Namely, the processing of the switch operation event is set and executed earlier than or prior to the processing of the A/D activation event or the memory storage event. Thus, it becomes possible to eliminate the fluctuation in the switching pulse width and realize accurate voltage detection with less dispersion.

In other words, this invention gives first priority to the operation of the flying capacitor voltage detecting circuit. The processing time allocated to the voltage read-in processing, which is substantially a CR charging operation, is assured sufficiently without being reduced unwontedly, even when the A/D conversion processing or the data transfer processing is delayed or unstable.

In general, the A/D conversion processing can be carried out in an overlapped manner with the operation of the flying capacitor voltage detecting circuit. The activation control of the A/D converter is simple compared with the control of the multiplexer type flying capacitor voltage detecting circuit. Causing a little bit of delay in the A/D conversion processing is not so serious. Similarly, as the data transfer processing is an operation for transferring the A/D converted data into a memory, causing a little bit of delay in the data transfer processing does not give adverse influence to the accuracy of the voltage detection.

According to the first voltage detecting apparatus for a combination battery of the present invention, it is preferable that the timing table sets the timing of the activation signal in such a manner that a voltage read-in timing of the A/D converter does not involve a switching timing of the flying capacitor voltage detecting circuit and a switching timing for data storage of the battery controller.

Namely, it is not necessary to execute the switching on-and-off processing and the A/D converter activation processing at the same time. Thus, it becomes possible to prevent the AD converter from being delayed in activation. Accordingly, it is always possible to keep a constant time interval from the turning-on timing of the output analog switch to the sampling timing. The dispersion in measurement among respective battery blocks due to leak current of the capacitor can be suppressed. Furthermore, it becomes possible to prevent the switching noise from being mixed and entered in the analog input voltage sample holding operation for the A/D conversion processing.

According to the first voltage detecting apparatus for a combination battery of the present invention, it is preferable that the timing table includes a first small table for designating the timing of the switching control signal and a second small table for designating the timing of the activation signal and the transfer command signal, being respectively regulated on the common time axis, and the battery controller refers to the first small table at time intervals shorter than those of the second small table.

More specifically, according to this arrangement, the table for producing a switching pattern (i.e., a table memorizing the switch operation event) is referred to frequently compared with the table for activating the A/D converter (i.e., a table memorizing the A/D activation event) or the table for storing the data into a memory (i.e., a table memorizing the memory storage event). This makes it possible to produce each switching control signal within a fine time width without increasing the bit number (data amount) for the timing control of all signals. It becomes possible to suppress the frequency in referring to the table for activating the A/D converter as well as the frequency in referring to the table for storing the memory. The computing load for the timing control can be reduced.

Furthermore, the present invention provides a second voltage detecting apparatus for a combination battery, including a flying capacitor voltage detecting circuit, an A/D converter, and a battery. The flying capacitor voltage detecting circuit has an input multiplexer and an output side sampling switch and executes the voltage read-in processing and the voltage read-out processing in a time sequential fashion to detect the voltage of a plurality of battery modules of a combination battery. The A/D converter is provided for A/D converting an analog output voltage of the flying capacitor voltage detecting circuit into a digital voltage signal. The battery controller is provided for reading the digital voltage signal produced from the A/D converter and storing the readout digital voltage signal into a data storage area assigned to each of the battery modules. Furthermore, according to the second voltage detecting apparatus, the battery controller includes a read-out order memory table for regulating voltage detection order of respective battery modules. The battery controller writes identification numbers of battery modules into the read-out order memory table in order of voltage largeness of respective modules detected previously. And, the battery controller controls the input multiplexer of the flying capacitor voltage detecting circuit in such a manner that, in the next voltage read-out processing of respective modules, the module voltages are successively read out in accordance with the order memorized in the read-out order memory table.

According to the second voltage detecting apparatus of the present invention, it becomes possible to suppress the electric potential change in the flying capacitor which varies in response to each read-in processing of the module voltage. This makes it possible to reduce the voltage read-in error or voltage read-out error in the flying capacitor voltage detecting circuit. It is also possible to reduce heat generation during the charge/discharge operation of the flying capacitor.

The second voltage detecting apparatus of the present invention is preferably employed in the case that a current-limiting resistance element is connected in series with an input side sampling switch of the multiplexer The resistance value R of this resistance element and the capacitance C of the flying capacitor cooperatively constitute a CR charging circuit working during the module voltage read-in processing. To accurately read the module voltage into the flying capacitor, it is necessary to reduce the time constant $\tau$=CR of this circuit. In other words, the capacitance of the flying capacitor needs to be reduced or the resistance value of the resistance element needs to be reduced. The former tends to increase the KTC noise and induces voltage reduction due to a parasitic capacitance. The latter induces deterioration in the current-limiting function in case of short-circuit accident.

According to the second voltage detecting apparatus of the present invention, the module voltage to be read in the next read-in processing is closest to the module voltage being read in the present read-in processing. Accordingly, it becomes possible to reduce the burden of the flying capacitor in the charge/discharge operation and reduce the read-in error.

According to the second voltage detecting apparatus of the present invention, it is preferable to execute the next module voltage read-out processing in order of largeness of the module voltage, considering the fact that the charged voltage of the flying capacitor decreases slightly in response to charged voltage read-out processing of the flying capacitor. According to the second voltage detecting apparatus, the flying capacitor should not be cleared (i.e., reset) after accomplishing the charged voltage read-out processing. Furthermore, according to the second voltage detecting apparatus, it is possible to obtain important information relating to occurrence of excessive charging at an earlier stage of the read-out processing of each module voltage.

BRIEF DESCRIPTION OF THE DRAWINGS

The above and other objects, features and advantages of the present invention will become more apparent from the following detailed description which is to be read in conjunction with the accompanying drawings, in which.

DESCRIPTION OF THE PREFERRED EMBODIMENTS

Preferred embodiments of the voltage detecting apparatuses for a combination battery in accordance with the present invention will be explained hereinafter with reference to attached drawings.

First Embodiment

<Overall Arrangement>

Figure 1:
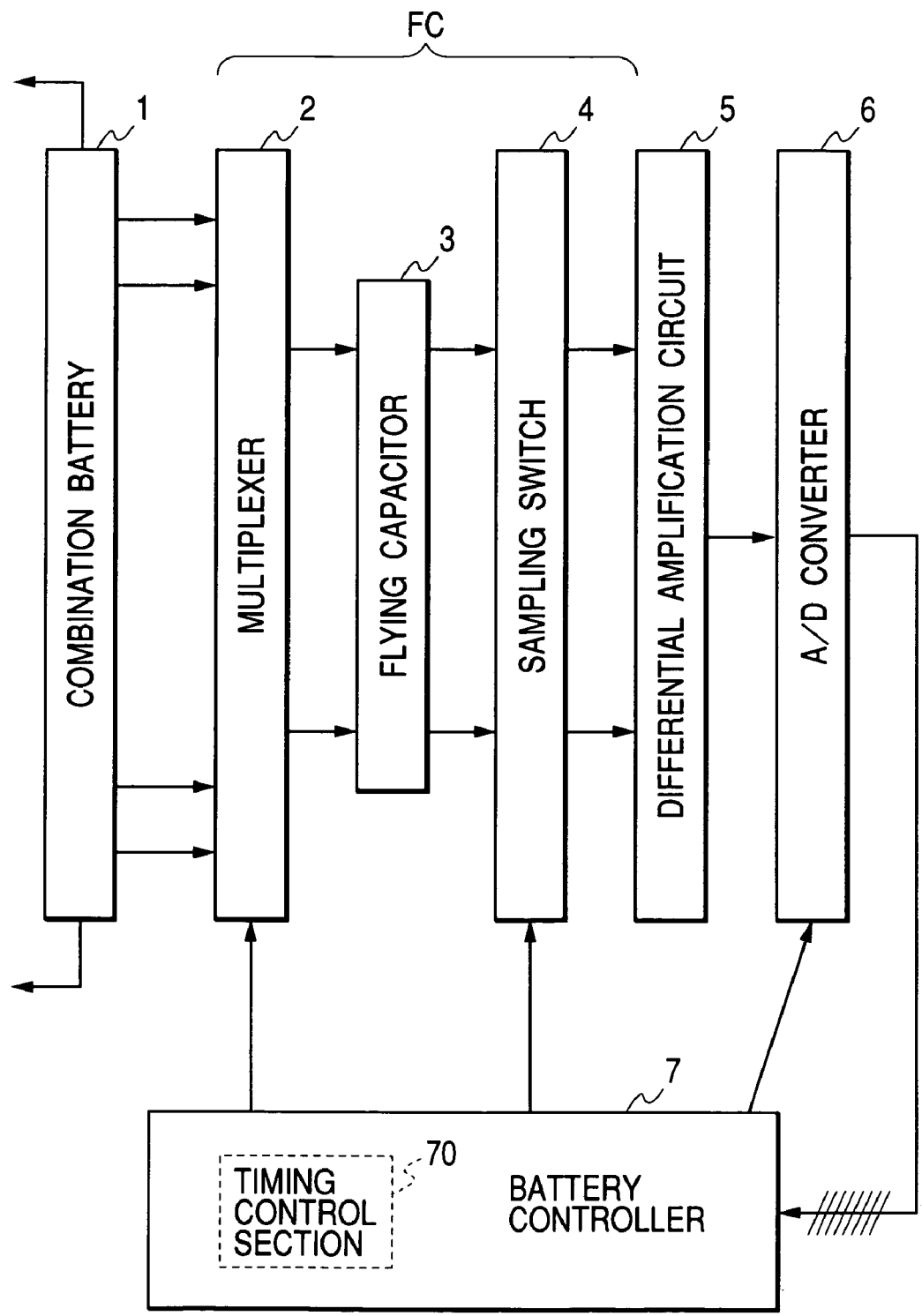
FIG. 1 is a block diagram showing a voltage detecting apparatus for a combination battery in accordance with a first embodiment of the present invention.

FIG. 1 shows a circuit block diagram of a voltage detecting apparatus for a combination battery in accordance with a first embodiment of the present invention. The potential difference (i.e., a module voltage) of respective battery modules of a combination battery 1 is successively selected by an input side multiplexer 2 of a flying capacitor voltage detecting circuit FC and is stored in a flying capacitor 3.

After an arbitrary module voltage is stored into the flying capacitor 3, each sampling switch (i.e., input side sampling switch) of the multiplexer 2 is turned off. The electric potential of the flying capacitor 3 becomes a floating electric potential. Then, an output side sampling switch 4 of the flying capacitor 3 is turned on. The charged voltage of the flying capacitor 3 is applied between a pair of input terminals of a differential amplification circuit 5.

The differential amplification circuit 5 amplifies an analog input voltage and produces an output supplied to an input side of an A/D converter 6.

The A/D converter 6 has a function of sample holding the input voltage and A/D converting the sample held voltage, and then holding a digital voltage signal resulting through the A/D conversion at its output port. The A/D converter 6 executes these sample holding, A/D converting, and output port overwriting operations in predetermined sequence with predetermined time intervals, in response to an A/D converter activation signal (hereinafter, simply referred to as "activation signal") entered from the outside into a built-in timing formation circuit so as to serve as an origin of the sequence.

A battery controller 7, having a microcomputer-based arrangement, outputs switching control signals to the multiplexer 2 and the output side sampling switch 4 to control the switching timings of these switching elements. Furthermore, the battery controller 7 outputs an activation signal to the A/D converter 6 to control the timing of its sample holding operation and output port overwriting operation. Furthermore, the battery controller 7 produces a transfer command signal and fetches the digital voltage signal held at the output port of the A/D converter 7 into a corresponding area of its own memory which is designated beforehand at the timing designated by the transfer command signal. In the process of fetching the digital voltage signal into its own memory, the battery controller 7 executes the physical value conversion (i.e., LSB conversion, gain and phase corrections, etc.) for converting the data format into appropriate form being easily handled in the microcomputer. Although the A/D converter is separated from the microcomputer in the above-described explanation, it is possible to arrange the microcomputer so as to incorporate the A/D converter.

<Arrangement of Flying Capacitor Voltage Detecting Circuit FC>

Figure 2:
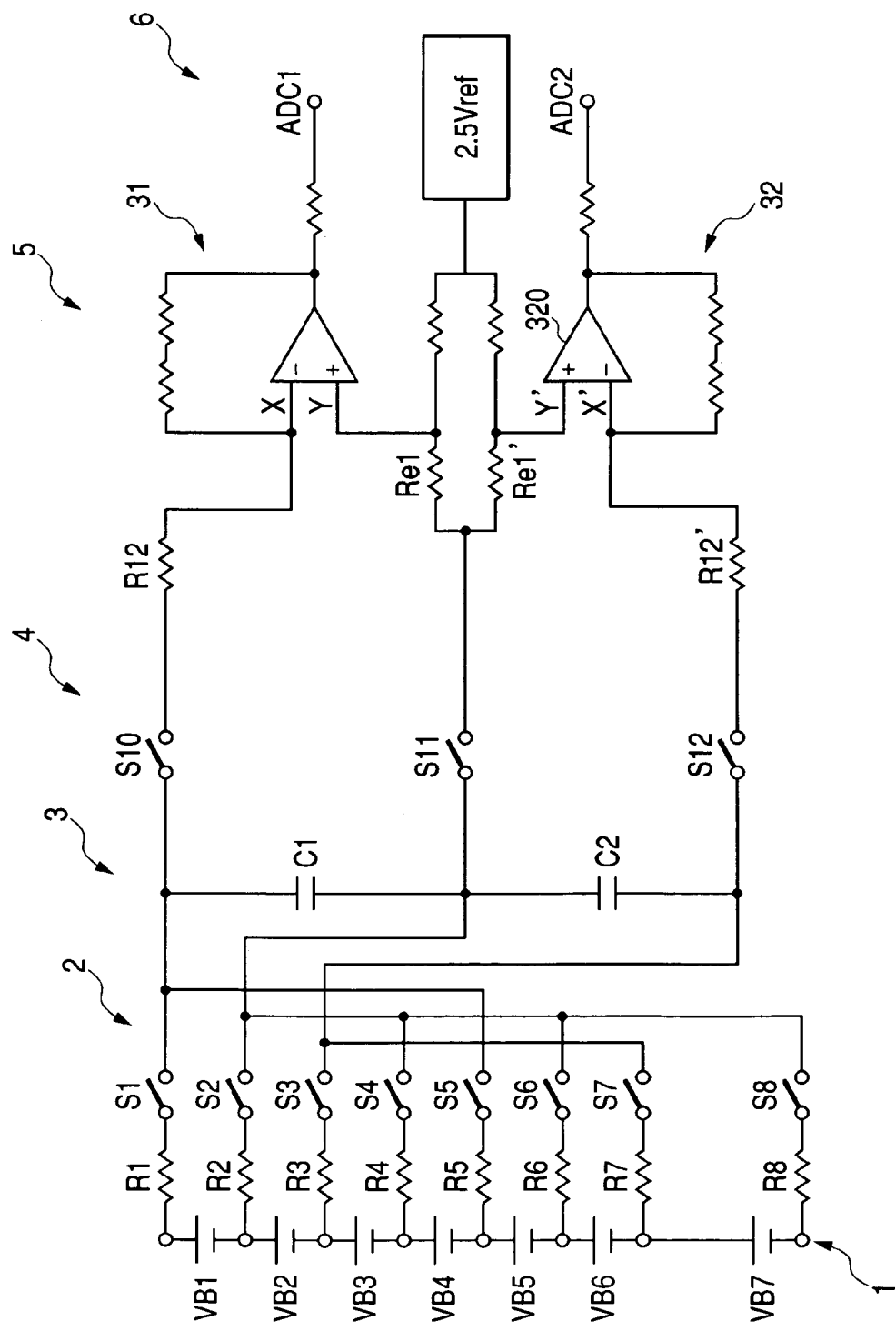
FIG. 2 is a circuit diagram showing a practical example of the flying capacitor voltage detecting circuit shown in FIG. 1.

FIG. 2 shows the flying capacitor voltage detecting circuit FC.

The combination battery 1 consists of a total of seven battery modules VB1 to VB7 which are connected in series. Each of the battery modules VB1 to VB7 includes the same number of cells which are connected in series. The multiplexer 2 consists of a total of eight current-limiting resistance elements R1 to R8 and the same number of sampling switches S1 to S8 serially connected to corresponding current-limiting resistance elements R1 to R8, respectively.

The flying capacitor 3 consists of first and second flying capacitors C1 and C2 which have the same capacitance. The sampling switches S1 and S5, i.e., the $(4m+1)^{th}$ sampling switch, are connected at one end to the $(4m+1)^{th}$ terminal of the combination battery 1 and at the other end to an independent terminal of the first flying capacitor C1, where m is 0 or positive integer. The sampling switches S3 and S7, i.e., the $(4m+3)^{th}$ sampling switch, are connected at one end to the $(4m+3)^{th}$ terminal of the combination battery 1 and at the other end to an independent terminal of the second flying capacitor C2, where m is 0 or positive integer. The sampling switches S2, S4, S6, and S8, i.e., the $2m^{th}$ sampling switches, are connected at one end to the $2m^{th}$ terminal of the combination battery 1 and at the other end to a connecting terminal of the flying capacitors C1 and C2, where m is 0 or positive integer and accordingly 2m is an even number.

The output side sampling switch 4 consists of a total of three sampling switches S10 to S12. The sampling switch S10 connects the independent terminal of first flying capacitor C1 via an input resistance element R12 to a first input terminal x of a first operational amplifier 31. The sampling switch S12 connects the independent terminal of second flying capacitor C2 via an input resistance element R12' to a first input terminal x' of a second operational amplifier 32. And, the sampling switch S11 connects the connecting point of the flying capacitors C1 and C2 to second input terminals Y and Y' of the operational amplifiers 31 and 32 via input resistance elements Rel and Rel', respectively.

The first and second operational amplifiers 31 and 32, cooperatively constituting a differential voltage detecting circuit, serve as the analog differential amplification circuit 5. The outputs of these operational amplifiers 31 and 32 are respectively sent to two A/D converters ADC1 and ADC2 which serve as the A/D converter 6 shown in FIG. 1.

Operation

First of all, the battery controller 7 turns on the sampling switches S1, S2, and S3 to read the voltage of battery module VB1 into the first flying capacitor C1 and the voltage of battery module VB2 into the second flying capacitor C2. Next, the battery controller 7 turns off the sampling switches S1, S2, and S3 and turns on the sampling switches S10 to S12 for a predetermined period of time to read the voltage difference of first flying capacitor C1 into the first operational amplifier 31 and the voltage difference of second flying capacitor C2 into the second operational amplifier 32. In this case, it is possible to execute the reading operation of the charged voltage of first flying capacitor C1 and the charged voltage of second flying capacitor C2 in a time sequential fashion. Next, the battery controller 7 turns on the sampling switches S3, S4, and S5 to read the voltage of battery module VB3 into the second flying capacitor C2 and the voltage of battery module VB4 into first flying capacitor C1. Hereinafter, by executing the switching control in the same manner, the voltage of each battery module is read out to the A/D converter 6. Although the above-described circuit arrangement provides two flying capacitors, it is possible to use only one flying capacitor or increase the total number of flying capacitors to three or more.

Timing Control

Figure 3:
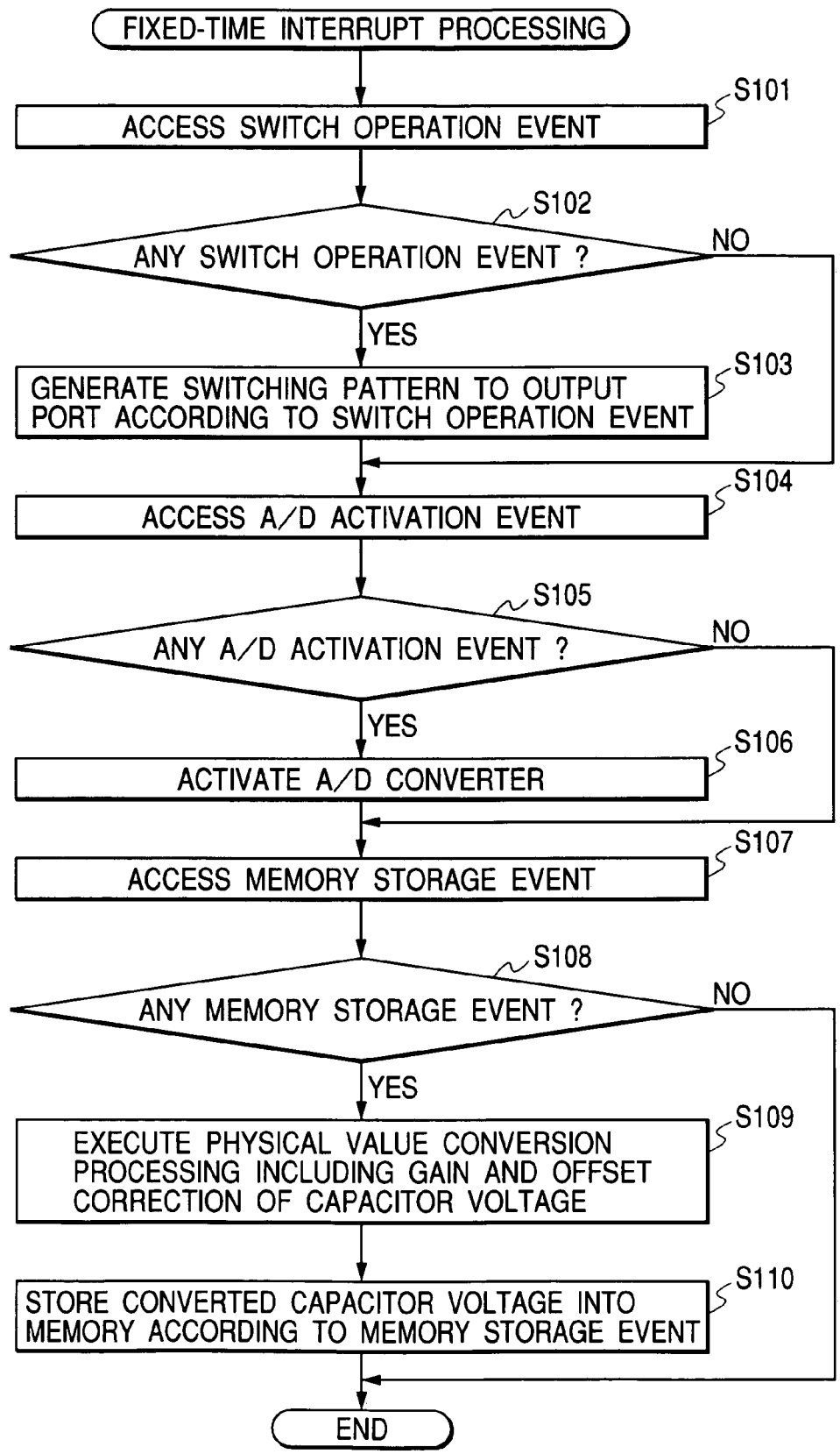
FIG. 3 is a flowchart showing the operation of the voltage detecting apparatus for the combination battery shown in FIG. 1.

FIG. 3 is a flowchart of the timing control routine showing an essential part of this embodiment. This timing control routine corresponds to the operation performed by a timing control section 70 of the battery controller 7 which is a forced interrupt executed at predetermined time intervals.

Figure 4:
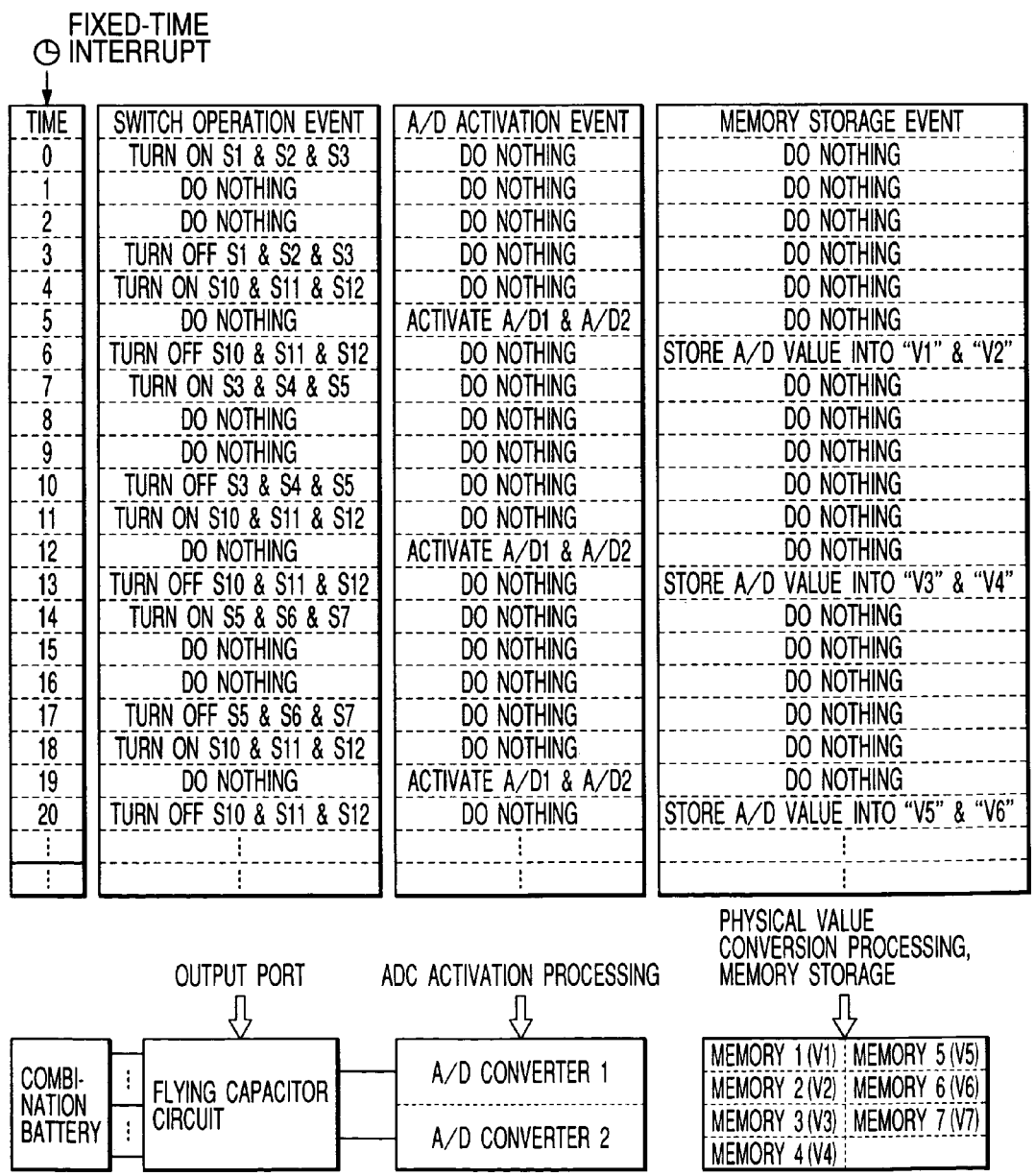
FIG. 4 is a timing table which is referred to in the flowchart shown in FIG. 3.

This timing control routine chiefly includes the read-in processing for reading the information described on a timing table shown in FIG. 4 at fixed timings, and the command processing for instructing the switching control for the input side sampling switches and the output side sampling switches shown in FIG. 2, the activation of A/D converter 6, and the data transfer processing (storage operation) from the A/D converter 6 to its own memory in accordance with the readout information.

The timing table in FIG. 4 shows execution events (i.e., execution instructions) to be executed at respective interrupt timings. The "time" shown in FIG. 4 represents each interrupt timing occurring at predetermine time intervals. This timing table describes switching control signal output commands (i.e., switch operation event), activation signal output commands (i.e., A/D activation event), and transfer command signal output commands (i.e., memory storage event) which are used in the process of reading the module voltage from all battery modules of the combination battery and storing the readout voltage data into the memory.

All of interrupt timings are determined and regulated on an ordinate axis (i.e., common time axis) of the timing table, in which progress of time accords to the counting action of a single (i.e., common) clock counter. This clock counter is a cyclic counter which counts all of the above-described interrupt timings listed on the timing table, and waits for a while (e.g., the above-described predetermined time interval according to this embodiment) so that the event being read out at the final interrupt timing can be completely performed. After this waiting time has passed, the clock counter is reset to restart the counting operation.

The fixed-time interrupt routine shown in FIG. 3 is activated when the count value of a built-in clock counter reaches the interrupt timing. First, the read-out processing of switch operation event and succeeding transmission stage of the switching control signals are carried out in the following manner.

The timing control section 70 accesses the switch operation event on the timing table (in step S101), and makes a judgment as to whether or not there is any switch operation event (in step S102). When no switch operation event exists (i.e., NO in step S102), the control flow jumps to step S104. When there is any switch operation event (i.e., YES in step S102), the timing control section 70 outputs a switching pattern of switching control signals corresponding to the readout switch operation event to the flying capacitor voltage detecting circuit FC (in step S103) and then proceeds to step S104.

Next, the read-out processing of A/D activation event and succeeding transmission stage of the activation signal are carried out in the following manner.

The timing control section 70 accesses the A/D activation event on the timing table (in step S104), and makes a judgment as to whether or not there is any A/D activation event (in step S105). When no A/D activation event exists (i.e., NO in step S105), the control flow jumps to step S107. When there is any A/D activation event (i.e., YES in step S105), the timing control section 70 outputs an activation signal corresponding to the readout A/D activation event to the A/D converter 6 (in step S106) and then proceeds to the step S107.

Next, the read-out of processing of memory storage event and succeeding transmission stage of the transfer command signal are carried out in the following manner.

The timing control section 70 accesses the memory storage event on the timing table (in step S107), and makes a judgment as to whether or not there is any memory storage event (in step S108). When no memory storage event exists (i.e., NO in step S108), the timing control section 70 terminates this routine. When there is any memory storage event (i.e., YES in step S108), the timing control section 70 executes a data transfer processing corresponding to the readout memory storage event to cause the microcomputer to read and correct the digital voltage signal held at the output port of the A/D converter 6 (in step S109). Then, the timing control section 70 stores the obtained voltage data into a designated memory area (in step S110). In this case, it is possible to execute the above-described voltage correction at different timing.

Figure 5:
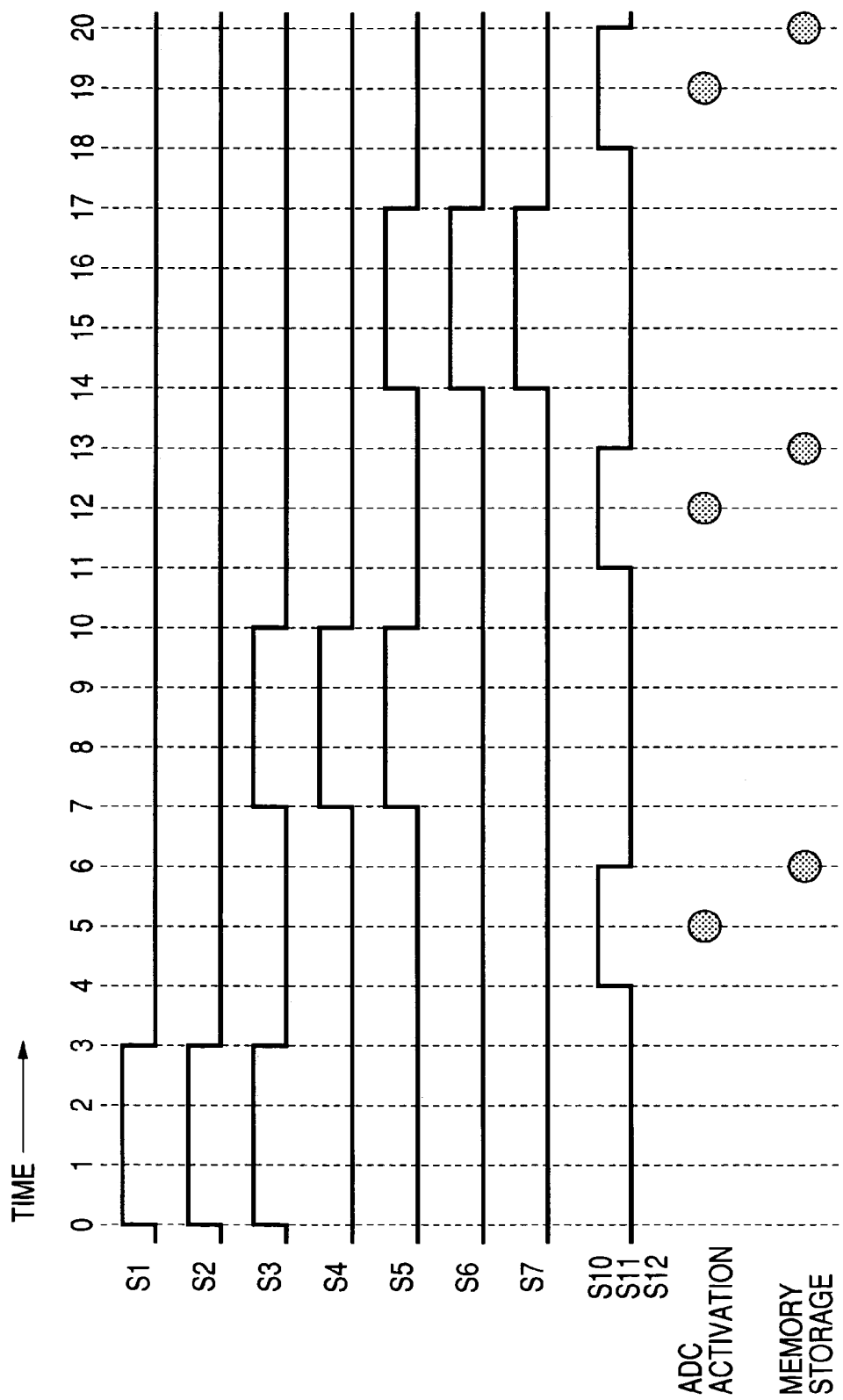
FIG. 5 is a timing chart showing the contents of the timing table shown in FIG. 4.

By carrying out respective controls explained in the flowchart of FIG. 3 at the above-described interrupt timings, various operation events listed on the timing table of FIG. 3 are sequentially executed and the voltage detecting processing for respective modules is accomplished thoroughly. FIG. 5 is a timing chart showing the contents of the timing table shown in FIG. 3.

Effect of Embodiment

First, according to the above-described embodiment, as shown in FIG. 3, in the fixed-time routine for the timing table read-in processing and succeeding output of the timing signal, generation of the switching control signal is executed earlier than or prior to generation of the activation signal or the transfer command signal. This arrangement effectively prevents the flying capacitor voltage detection from being delayed, so that the flying capacitor voltage detection can be surely accomplished prior to the A/D conversion or the data transfer. In other words, no adverse influence is given to the later-performed A/D conversion or the data transfer processing. Furthermore, it becomes possible to suppress the fluctuation in the switching pulse width from. Accurately securing the charging time of each capacitor is feasible.

Namely, in an event that any A/D activation event or any memory storage event coexists with a switch operation event at the same interrupt timing on the timing table, the present invention gives first priority to the processing of the switch operation event.

Furthermore, as shown in FIGS. 4 and 5, activation of the AD converter is performed within a period of time where the switching control signals supplied to the input side sampling switches and to the output side sampling switches of the flying capacitor voltage detecting circuit are stable (i.e., not unchanged). This is effective to eliminate delay in the activation of AD converter. Thus, it becomes possible to execute the sampling at the constant timing (i.e., when a predetermined time has passed) after the output analog switch is changed. It becomes possible to eliminate error or dispersion in the measured voltage occurring due to superposition of the switching control signal.

Furthermore, the timing table includes a first small table (i.e., the switch operation event table) for designating the timing of the switching control signals and a second small table (i.e., the A/D activation event table and the memory storage event table) for designating the timings of the activation signal and the transfer command signal, being respectively determined and regulated on the common time axis. The battery controller (frequently) refers to the first small table at time intervals shorter than those of the second small table. Accordingly, the table reference processing can be simplified.

Second Embodiment

Figure 6:
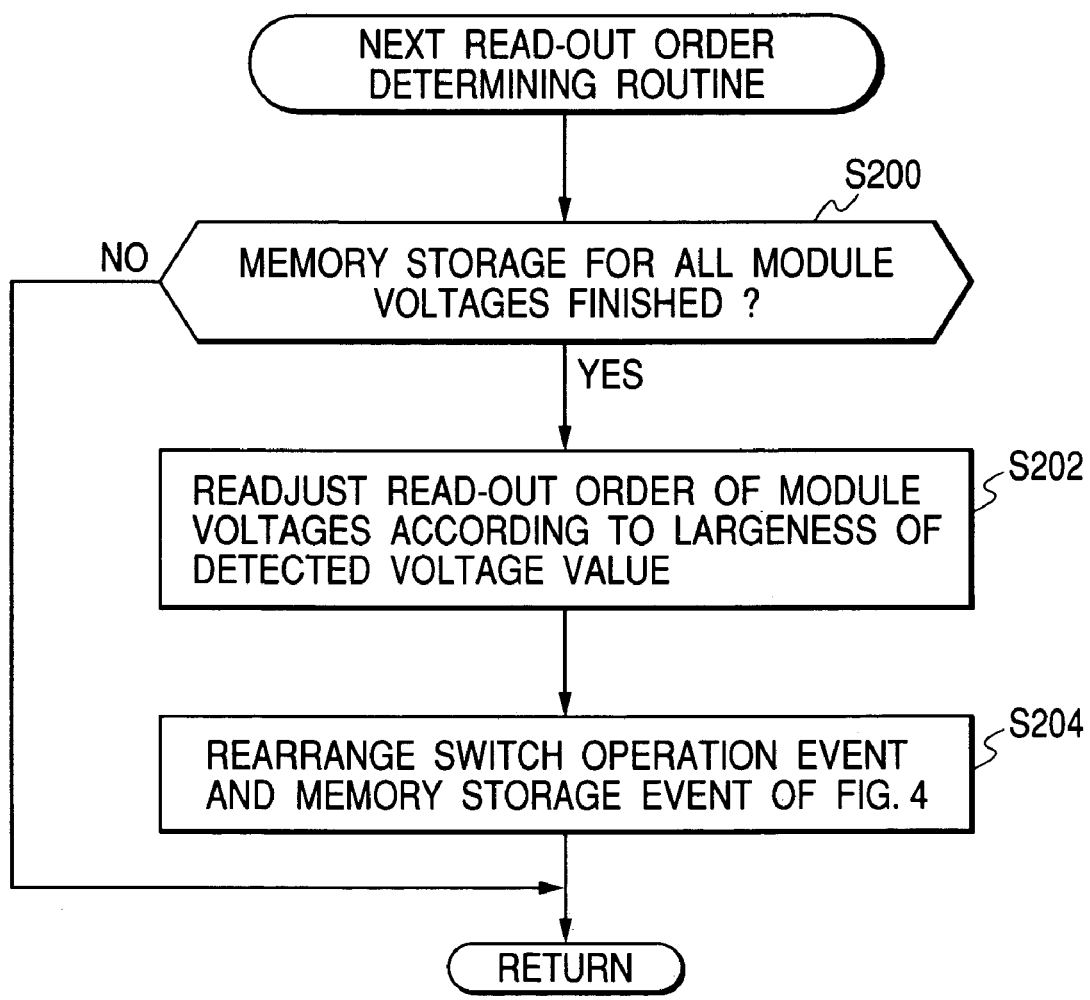
FIG. 6 is a flowchart showing the processing for designating the read-out order of battery modules of the voltage detecting apparatus for a combination battery in accordance with a second embodiment of the present invention.

FIG. 6 is a flowchart showing the operation in accordance with another embodiment of the present invention.

This embodiment is, in short, characterized in that the next read-out order of module voltages is determined with reference to the largeness of respective module voltages being previously read. To simplify the explanation, this embodiment uses only one flying capacitor. However, it is needless to say that a plurality of flying capacitors can be used as shown in FIG. 2. In this case, each flying capacitor is provided for a group of module voltages and in each group the order of each battery module is determined considering the largeness of the module voltage. The determined order is memorized in the table with the identification number of respective battery modules. And, the next read-out processing is executed based on this table.

First, the timing control section 70 checks whether or not the read-out processing (including memory storage processing) for all of the module voltages is finished (in step S200). When the read-out processing is not finished yet (i.e., NO in step S200), timing control section 70 terminates this routine to return to the main routine. When the read-out processing is thoroughly finished (i.e., YES in step S200), the timing control section 70 rearranges the detected module voltages in order of largeness and stores the identification number of each module voltage into a read-out order memory table (in step S202). The order adjusted or rearranged in this step is referred to as reading-out order in the next read-out processing. Then, the timing control section 70 rearranges the switch operation event and the memory storage event listed on the timing table of FIG. 4 according to the read-out order memorized in this table (in step S204).

With this arrangement, each flying capacitor can read almost the same voltage (although it becomes small a little bit) in every read-in processing. Thus, it becomes possible to reduce the charge/discharge current of the flying capacitor and accordingly it becomes possible to effectively prevent the read-in accuracy from deteriorating depending on a CR time constant.

In the case that the timing table of FIG. 3 is frequently rewritten as explained in this embodiment, the timing table should be stored in RAM. On the other hand, when the timing table is unchanged as described in the first embodiment, it is preferable to store the time table in PROM or in ROM.

What is claimed is:

1. A voltage detecting apparatus for a combination battery comprising:
   a multiplexer type flying capacitor voltage detecting circuit having an input multiplexer and an output side sampling switch, whose operation timing is controlled in response to an entered switching control signal for time sequentially executing voltage read-in processing and voltage read-out processing to detect the voltage of a plurality of battery modules of a combination battery in a time sequential fashion;
   a synchronous control type A/D converter whose operation timing is controlled in response to an entered activation signal for sample holding and A/D converting an analog output voltage of said flying capacitor voltage detecting circuit, and holding a digital voltage signal as a resulting output until a succeeding digital voltage signal is obtained; and
   a battery controller whose operation timing is controlled in response to an entered transfer command signal for reading said digital voltage signal produced from said A/D converter and storing the readout digital voltage signal into a data storage area assigned to each of said battery modules,
   wherein said battery controller comprises a timing table on which generation timings of said switching control signal, said activation signal, and said transfer command signal are all determined on a common time axis, and
   timing control for said flying capacitor voltage detecting circuit, said A/D converter, and said battery controller is carried out by outputting said switching control signal, said activation signal, and said transfer command signal to said flying capacitor voltage detecting circuit, said A/D converter, and said battery controller at the timing regulated in said timing table and according to an order memorized in said timing table.

2. The voltage detecting apparatus for a combination battery in accordance with claim 1, wherein said battery controller gives first priority to the output of said switching control signal supplied to said flying capacitor voltage detecting circuit in a case that said timing table regulates signal generation timings in such a manner that the generation timing of said switching control signal equals to or overlaps with the generation timing of said activation signal or said transfer command signal.

3. The voltage detecting apparatus for a combination battery in accordance with claim 1, wherein
   said timing table sets the timing of said activation signal in such a manner that a voltage read-in timing of said A/D converter does not involve a switching timing of said flying capacitor voltage detecting circuit and a switching timing for data storage of said battery controller.

4. The voltage detecting apparatus for a combination battery in accordance with claim 1, wherein
   said timing table includes a first small table for designating the timing of said switching control signal and a second small table for designating the timing of said activation signal and said transfer command signal, being respectively regulated on the common time axis, and
   said battery controller refers to said first small table at time intervals shorter than those of said second small table.

5. A voltage detecting apparatus for a combination battery, comprising
   a flying capacitor voltage detecting circuit having an input multiplexer and an output side sampling switch and executing voltage read-in processing and voltage read-out processing in a time sequential fashion to detect the voltage of a plurality of battery modules of a combination battery;
   an A/D converter for A/D converting an analog output voltage of said flying capacitor voltage detecting circuit into a digital voltage signal; and
   a battery controller for reading said digital voltage signal produced from said A/D converter and storing the readout digital voltage signal into a data storage area assigned to each of said battery modules,
   wherein said battery controller comprises a read-out order memory table for regulating voltage detection order of respective battery modules,
   said battery controller writes identification numbers of battery modules into said read-out order memory table in order of voltage largeness of respective modules detected previously, and
   said battery controller controls said input multiplexer of said flying capacitor voltage detecting circuit in such a manner that, in the next voltage read-out processing of respective modules, the module voltages are successively read out in accordance with the order memorized in said read-out order memory table.

6. The voltage detecting apparatus in accordance with claim 1, wherein the battery controller comprises a timing control section for producing the switching control signal indicating a switching pattern corresponding to a switch operation event when there is the switch operation event in the timing table, outputting the switching control signal to the multiplexer type flying capacitor voltage detecting circuit to control the operation timing of the output side sampling switch and the input multiplexer, producing the activation signal corresponding an A/D activation event when there is the A/D activation event in the timing table, outputting the activation signal to the A/D converter to control the operation timing of the A/D converter, producing the transfer command signal corresponding a memory storage event when there is the memory storage event in the timing table, and outputting the transfer command signal to the battery controller to control the operation timing of the battery controller.

* * * * *